(12) United States Patent
Sugawara et al.

(10) Patent No.: US 8,388,865 B2
(45) Date of Patent: Mar. 5, 2013

(54) CONDUCTIVE POLYMER COMPOSITION, METHOD OF PRODUCING THE SAME, AND SOLID ELECTROLYTIC CAPACITOR

(75) Inventors: Yasuhisa Sugawara, Sendai (JP); Tomoki Nobuta, Sendai (JP); Naoki Takahashi, Sendai (JP); Ryuta Kobayakawa, Sendai (JP); Satoshi Suzuki, Sendai (JP)

(73) Assignee: NEC Tokin Corporation, Sendai-Shi (JP)

( * ) Notice: Subject to any disclaimer, the term of this patent is extended or adjusted under 35 U.S.C. 154(b) by 705 days.

(21) Appl. No.: 12/585,652

(22) Filed: Sep. 21, 2009

(65) Prior Publication Data

US 2010/0091432 A1   Apr. 15, 2010

(30) Foreign Application Priority Data

Oct. 15, 2008   (JP) .................................. 2008-265867

(51) Int. Cl.
*H01B 1/00* (2006.01)
*H01G 9/00* (2006.01)
*C08G 75/00* (2006.01)

(52) U.S. Cl. ........................ 252/500; 361/523; 528/377

(58) Field of Classification Search ....... 252/500–521.6; 528/377, 422, 423; 361/523
See application file for complete search history.

(56) References Cited

U.S. PATENT DOCUMENTS

| 6,987,663 B2 * | 1/2006 | Merker et al. ................ 361/523 |
| 2009/0021894 A1 | 1/2009 | Ning et al. |
| 2011/0001720 A1 * | 1/2011 | Asai et al. ..................... 345/174 |
| 2012/0120557 A1 * | 5/2012 | Sugawara et al. ............. 361/525 |

FOREIGN PATENT DOCUMENTS

| JP | B2-2636968 | 8/1997 |
| JP | A-2001-270999 | 10/2001 |
| JP | B2-3722839 | 11/2005 |
| JP | A-2006-265297 | 10/2006 |
| JP | A-2007-103558 | 4/2007 |
| JP | B2-4077675 | 4/2008 |
| WO | WO 2007/091656 A1 | 8/2007 |

* cited by examiner

*Primary Examiner* — Mark Kopec
*Assistant Examiner* — Jaison Thomas
(74) *Attorney, Agent, or Firm* — Oliff & Berridge, PLC.

(57) ABSTRACT

A conductive polymer composition with excellent water resistance and conductivity, and a solid electrolytic capacitor with low ESR, excellent reliability, and especially moisture resistance. The conductive polymer composition includes a conductive polymer, a polyanion that includes a hydrophilic group, where the polyanion functioning as a dopant of the conductive polymer. At least a part of the hydrophilic group of the polyanion is condensed with an epoxy group in a compound with one epoxy group. A solid electrolytic capacitor of the present invention includes the conductive polymer composition.

18 Claims, 2 Drawing Sheets

CONDUCTIVE POLYMER COMPOSITION, METHOD OF PRODUCING THE SAME, AND SOLID ELECTROLYTIC CAPACITOR

BACKGROUND OF THE INVENTION

1. Field of the Invention

The present invention relates to a conductive polymer composition and a method of producing the same. The present invention further relates to a solid electrolytic capacitor provided with the abovementioned conductive polymer composition.

2. Description of the Related Art

A conductive polymer material is used for electrodes of a capacitor, a dye-sensitized solar cell, and an electroluminescent display, etc. As such conductive polymer material, highly molecularized polymer materials, such as pyrrole, thiophene, 3,4-ethylenedioxythiophene, and aniline, are well known. The conductive polymer material disclosed in Japanese Patent Nos. 2636968 and 4077675, which is formed using a conductive polymer suspension with polyanions as a dopant, attracts attentions in the field of electronic materials or the like as such conductive polymer material exhibits high conductivity.

Japanese Patent No. 2636968 describes polythiophene dispersions, their production, and the use of the salts for the antistatic treatment of plastic moldings. Further, Japanese Patent No. 4077675 discloses an aqueous dispersion of composite of poly(3,4-dialkoxythiophene) with polyanions and a method for producing the same, a coating composition including the aqueous dispersion, and a coating substrate including a transparent conductive film having the composition coated thereon. Both of the disclosures by Japanese Patent Nos. 2636968 and 4077675 are characterized by polythiophene made of the structural units of 3,4-dialkoxythiophene, polythiophene dispersions containing polyanions of polystyrene sulfonic acid origin, a method of producing the same, and the use of the salts for the antistatic treatment of plastic moldings.

Such conductive polymer composition, which is formed using a conductive polymer dispersion solution with a polyanion having multiple hydrophilic functional groups, includes multiple hydrophilic functional groups originated from polyanions not doped to conductive polymer in a conductive polymer composition. An undoped hydrophilic functional group has extremely high hydrophilic property as compared with a doped hydrophilic functional group.

Thus, there are faults that the conductive polymer composition having multiple undoped hydrophilic functional groups is generally low water resistance and is remelted to a polar solvent such as water.

Moreover, a solid electrolytic capacitor using this conductive polymer composition for a cathode layer has a disadvantage that reliability and characteristics deteriorates especially under high humidity atmosphere.

In order to solve the problems of the conductive polymer composition with multiple hydrophilic functional groups, Japanese Patent No. 3722839 and Japanese Unexamined Patent Application Publication No. 2001-270999 disclose a method to add a resin or the like that reacts with hydrophilic functional groups. Japanese Patent No. 3722839 describes a soluble conductive polymer having a sulfonic acid and/or a carboxylic acid self-doped functional group in a conductive polymer chain, a composition including a cross-linking compound having at least 2 or more functional groups which are capable of reacting with the self-doped functional group, a cross-linking electrical conductor formed by reacting the soluble conductive polymer and the cross-linking compound, and an antistatic treatment and a capacitor using the cross-linking electrical conductor. The disclosure of Japanese Patent No. 3722839 is characterized by containing a conductive polymer having a hydrophilic self-doped functional group in a molecule chain because of its soluble property and a cross-linking compound having 2 or more functional groups capable of reacting with the self-doped functional group. The functional group is selected from a hydroxyl group, a silanol group, a thiol group, an amino group, and an epoxy group.

Japanese Unexamined Patent Application Publication No. 2001-270999 describes a soluble conductive polymer having a sulfonic acid and/or a carboxylic self-doped functional group in a conductive polymer chain, and a composition including a silane coupling agent and/or colloidal silica having a functional group capable of reacting with the self-doped functional group. Japanese Unexamined Patent Application Publication No. 2001-270999 further describes a cross-linking electrical conductor formed by reacting the abovementioned soluble conductive polymer and the cross-linking compound. The disclosure of Japanese Unexamined Patent Application Publication No. 2001-270999 is characterized by containing a soluble conductive polymer having a hydrophilic self-doped functional group in a molecule chain because of its soluble property and a silane coupling agent and/or colloidal silica having one functional group capable of reacting with the self-doped functional group. The functional group is selected from a hydroxyl group, a thiol group, an amino group, and an epoxy group.

As compared to a conductive polymer having a hydrophilic self-doped functional group in a molecule chain, the conductive polymer composition formed using a conductive polymer dispersion solution with polyanions as a dopant has higher conductivity but lower water resistance as multiple undoped hydrophilic functional groups exist in the conductive polymer composition.

SUMMARY OF THE INVENTION

The effect to improve the water resistance is insufficient when adding to a conductive composition having polyanions as a dopant, a cross-linking compound having 2 or more functional groups capable of reacting with the self-doped functional group disclosed in Japanese Patent No. 3722839. The above-mentioned functional group is selected from a hydroxyl group, a silanol group, a thiol group, an amino group, and an epoxy group. This is because that the cross-linking compound has a cross-linked structure that becomes a steric hindrance to block from intruding into the conductive polymer chain, and the cross-linking compound is not spread into the conductive polymer chain.

Further, the effect to improve the water resistance is still insufficient when adding to a conductive polymer suspension solution before forming a conductive composition with polyanions as a dopant, a silane coupling agent having a functional group capable of reacting with the self-doped functional group disclosed in Japanese Unexamined Patent Application Publication No. 2001-270999. The abovementioned functional group is selected from a hydroxyl group, a thiol group, an amino group, and an epoxy group. The reason for this is explained hereinafter. The conductive polymer suspension solution is generally a strong acidic solution of about pH1. As a silane coupling agent causes a condensation reaction in a strong acidic solution in general, the silane coupling agent becomes bulky. Then, similarly as the cross-linking compound, the silane coupling agent cannot be fully spread into the undoped hydrophilic functional group, and thus leading to insufficient effect to improve water resistance.

The objectives of the present invention is to provide a conductive polymer composition with high conductivity and excellent water resistance, and a solid electrolytic capacitor with low Equivalent Series Resistance (hereinafter referred to as ESR), excellent reliability, and especially moisture resistance.

The present invention has been considered to solve the above problems and has the following configuration.

The conductive polymer composition according to the present invention includes a conductive polymer, a polyanion that includes a hydrophilic group, where the polyanion functions as a dopant of the conductive polymer. Further, at least a part of the hydrophilic group of the polyanion is condensed with an epoxy group in a compound with one epoxy group.

It is preferable that at least a part of the hydrophilic group of the polyanion is converted to a group with a weaker hydrophile property than the hydrophilic group by condensing with the epoxy group. The epoxy group and the hydrophilic group of the polyanion are condensed in a conductive polymer suspension solution that includes the conductive polymer with the polyanion as a dopant and the compound with one epoxy group. After the condensation or in a same process as the condensation, a solvent in the conductive polymer suspension solution is evaporated. Then the conductive polymer composition is obtained.

The compound with one epoxy group and the polyanion are preferably reacted by heat from 100.degree. C. to 250.degree. C.

Further, the conductive polymer is preferably thiophene or its derivative. The polyanion is preferably polystyrene sulfonic acid origin.

A method of producing a conductive polymer composition according to the present invention includes preparing a suspension solution, where the suspension solution is made by dispersing a conductive polymer with a polyanion as a dopant in water, a polar organic solvent, or a mixture of water and the polar organic solvent, adding a compound with one epoxy group to the suspension solution, reacting the polyanion with the epoxy group, and evaporating the solvent in the suspension solution.

The polyanion and the compound with one epoxy group are preferably reacted by heat from 100.degree. C. to 250.degree. C.

A solid electrolytic capacitor according to the present invention uses a conductive polymer composition to a solid electrolyte layer. The conductive polymer composition includes a conductive polymer, and a polyanion that includes a hydrophilic group, where the polyanion functions as a dopant of the conductive polymer. In the conductive polymer composition, at least a part of the hydrophilic group of the polyanion is condensed with the epoxy group in a compound with one epoxy group.

It is preferable that at least a part of the hydrophilic group of the polyanion is converted to a group with a weaker hydrophile property than the hydrophilic group by condensing with the epoxy group.

Moreover, the epoxy group and the hydrophilic group of the polyanion are condensed in a conductive polymer suspension solution that includes the conductive polymer with the polyanion as a dopant and the compound with one epoxy group. After the condensation or in a same process as the condensation, a solvent in the conductive polymer suspension solution is evaporated. Then the conductive polymer composition is obtained.

Further, the conductive polymer is preferably thiophene or its derivative. The polyanion is preferably polystyrene sulfonic acid origin.

According to the present invention, organic materials and a solid electrolytic capacitor with high electrical conduction and excellent water resistance can be achieved by the conductive polymer suspension solution containing a conductive polymer with the polyanions as a dopant and the compound with one epoxy group.

The compound with one epoxy group has one junction and is not cross-linked structure, thereby not blocking from intruding into the conductive polymer chain. Therefore, the compound can be spread sufficiently. In addition, only a small amount of the solution is required to cause a reaction. The compound with one epoxy group is sufficiently spread into the hydrophilic functional groups in the polyanions not doped to the conductive polymer, and the hydrophilic functional group reacts with the epoxy group by heat or ultraviolet rays, thereby weakening the hydrophile property of the polyanion. The conductive polymer composition obtained by drying the conductive polymer suspension solution after this reaction is excellent in water resistance and also has high conductivity.

A solid electrolytic capacitor with excellent reliability, especially moisture resistance, and low ESR can be realized when using the conductive polymer composition for an electrode of the solid electrolytic capacitor.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
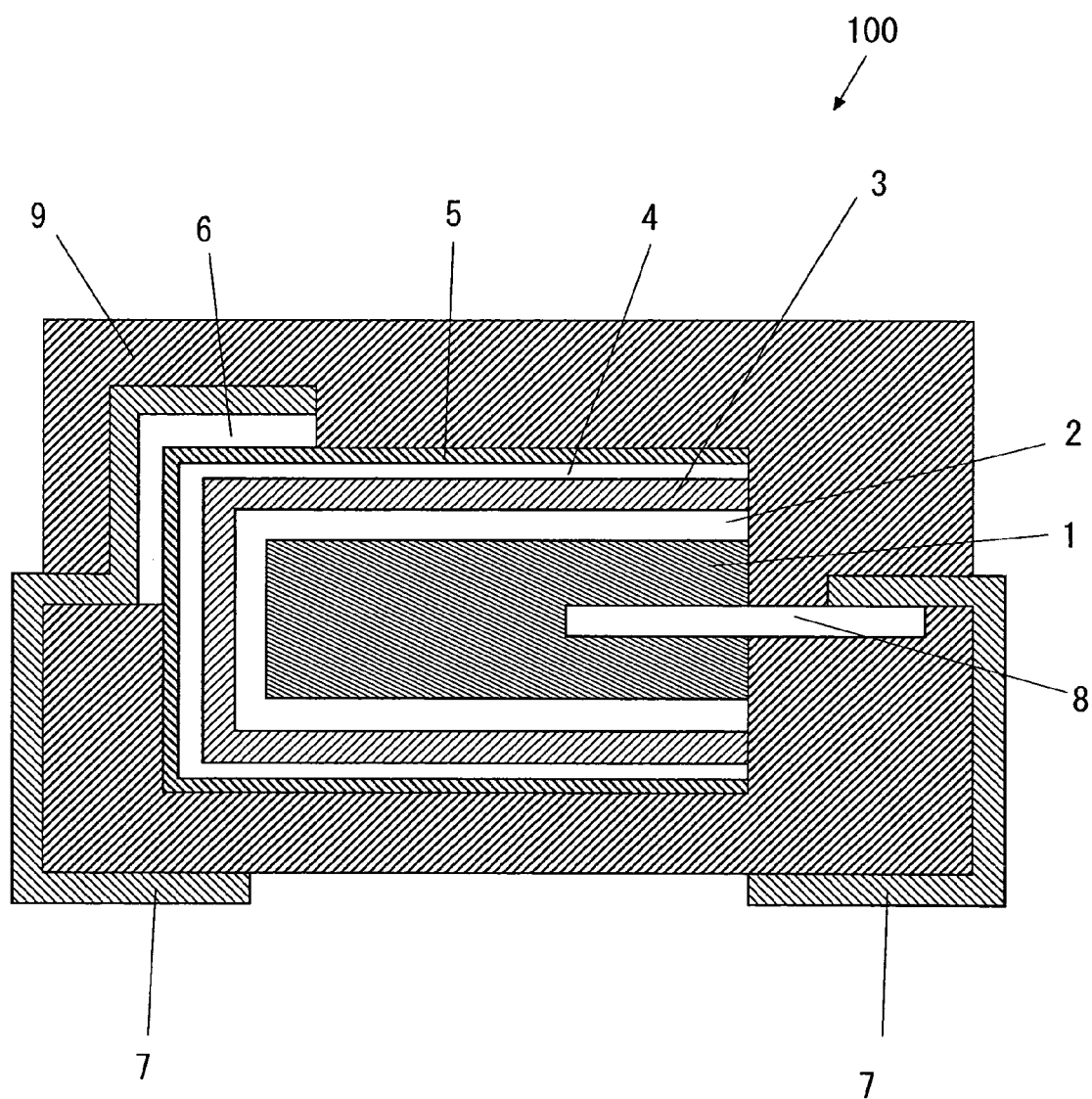
FIG. 1 is a cross-sectional diagram illustrating the structure of a solid electrolytic capacitor according to the present invention.

A conductive polymer composition formed using a conductive polymer suspension solution and a solid electrolytic capacitor using the conductive polymer composition as a part of its electrode are described hereinafter.

A conductive polymer with polyanions as a dopant used for the conductive polymer suspension solution is preferably pyrrole, a thiophene, furan, and their derivatives. In the light of conductivity and heat-resistance, the polymer is especially preferable to be 3,4-ethylenedioxythiophene polymer. The dopant is preferably polyanions, such as polystyrene sulfonic acid ion, polyvinyl sulfonic acid ion, polymaleic acid ion, and polyacrylic acid ion. In the light of dispersibility of conductive polymer particles in the solution and conductivity, polystyrene sulfonic acid ion is especially preferable.

The solvent of the conductive polymer suspension solution is preferably water, a polar organic solvent, such as alcohol, acetone, acetonitrile, and ethylene glycol, or a mixed solvent of water and polar organic solvent. In the light of simple installment of an exhaust equipment for the solvent that vapors in a drying process of the conductive polymer suspension solution, low environmental load, and the ease of removal, the solvent of the conductive polymer suspension solution is especially preferable to be water.

As a compound with one epoxy group contained in the conductive polymer suspension solution, there are allyl glycidyl ether, 2-ethylhexyl glycidyl ether, phenyl glycidyl ether, p-tert-buthylphenyl glycidyl ether, N-glycidyl phthalimide, dibromophenyl glycidyl ether, poly(1-5)oxyalkylene(C2-4) phenyl glycidyl ether, poly(1-5)oxyalkylene(C2-4)methylphenyl glycidyl ether, alkyl(C8-18)polyoxyalkylene glycidyl ether, etc. Especially preferable compounds are allyl glycidyl ether and phenyl glycidyl ether, whose molecular weights are 150 or less, no side chain, and a little steric hindrance.

It is desirable that the amount of addition of the compound with one epoxy group to the number of the hydrophilic functional groups in the polyanion is 50% or less. If the amount of addition of the compound with one epoxy group exceeds 50%, the hydrophilic functional group doped to the conductive polymer may react, thereby possibly leading to lose the conductivity.

The polyanions as a dopant in the conductive polymer suspension solution reacts with the compound with one epoxy group by heat or ultraviolet rays. By heating, the reaction and drying process for forming the conductive polymer composition can be performed consistently. The heating temperature is preferably from 100.degree. C. to 250.degree. C.

If the heating temperature is less than 100.degree. C., the reaction may not sufficiently progress. If the heating temperature exceeds 250.degree. C., the conductivity of the conductive polymer composition may be lost.

The hydrophilic functional group in the polyanion reacts with the epoxy group at the temperature of about 120.degree. C. The conductivity of the conductive polymer composition obtained by reacting and then drying will not be lost by controlling the temperature.

FIG. 1 is a cross-sectional diagram illustrating the structure of a solid electrolytic capacitor according to the present invention. As shown in FIG. 1, a solid electrolytic capacitor 100 according to the present invention includes a valve metal 1, a dielectric oxide film layer 2, a conductive polymer layer 3, a graphite layer 4, a silver layer 5, a conductive adhesive 6, exterior electrodes 7, a valve metal lead 8, and an exterior resin 9. The structure of the solid electrolytic capacitor 100 of the present invention is basically same as the solid electrolytic capacitor of the related art except that the conductive polymer composition according to the present invention is used as the conductive polymer layer 3. Thus, known shapes and materials can be adapted and there is no limitation thereto in particular.

In the solid electrolytic capacitor 100 according to the present invention, the dielectric oxide film layer 2 of the valve metal is formed to the valve metal 1. To form the conductive polymer layer 3 over the dielectric oxide film layer 2, the compound with one epoxy group and polyanions in the above-mentioned conductive polymer suspension solution are reacted by irradiating with ultraviolet rays or heating, and the suspension solution is dried. Then, a cathode layer built up of the graphite layer 4 and the silver layer 5 is formed over the conductive polymer layer 3. Then, the solid electrolytic capacitor 100 is obtained.

There is no problem when forming the conductive polymer layer 3 using the conductive polymer composition of the present invention together with a conductive polymer formed by chemical polymerization and electrolytic polymerization.

The valve metal 1 is formed of a plate for valve metal, sintered body which is made of metal particulates including a foil or line and a valve action, and a porous metal whose surface area is extended by etching. As for the valve metal, there are tantalum, aluminum, titanium, niobium, zirconium, or alloys thereof. It is preferably at least one of tantalum, aluminum, or niobium.

The dielectric oxide film 2 is a film formed by electrolytically oxidizing the surface of the valve metal and is formed in holes of a sintered body and a porous body or the like. The thickness of the dielectric oxide film layer can be adjusted as appropriate by the voltage of the electrolytic oxidation.

EXAMPLE

Although the present invention will be explained hereinafter in detail with examples, the present invention is not limited only to these examples.

Example 1

First, a conductive polymer suspension solution was prepared. As the conductive polymer with polyanions as a dopant, polyethylenedioxythiophene was used, polystyrene sulfonic acid ion was used as a dopant, allyl glycidyl ether was used as the compound with one epoxy group, and they are dissolved and dispersed in water. Next, 100 μL of the conductive polymer suspension solution was dropped over a glass substrate. Then, the glass substrate was reacted and dried in a constant temperature bath at 125.degree. C. to form a conductive polymer composition film.

Figure 2:
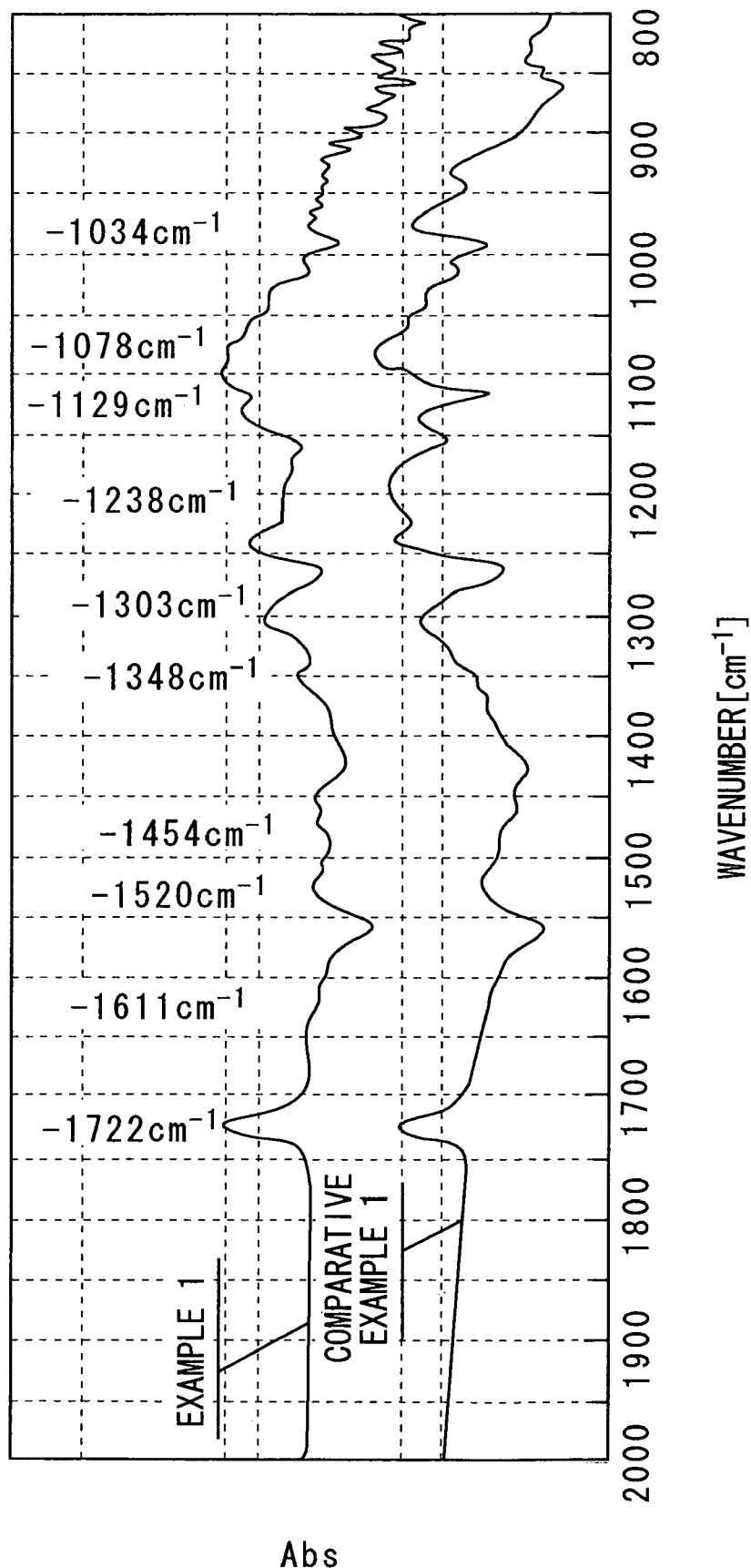
FIG. 2 illustrates the analysis result by FTIR.

The status of the sulfone group, which is a hydrophilic functional group of polystyrene sulfonic acid origin included in the conductive polymer composition film, was evaluated by FTIR (Fourier Transform Infrared Spectroscopy). The analysis result by FTIR is shown in FIG. 2.

Next, a surface resistance and a film thickness of the conductive polymer composition film were measured by the four-terminal method to calculate the conductivity (S/cm). In addition, the conductive polymer composition film formed over the glass substrate together with the glass substrate was immersed in water to evaluate the water resistance of the conductive polymer composition film. The measurement result of the conductivity and the water resistance evaluation result are shown in Table 1. As for the water resistance, "Good" indicates that no dissolution and swelling were confirmed at the time of immersion in water, "Film swollen" indicates that there was no dissolution but film was swollen at the time of immersion in water, and "Bad" indicates that dissolution was confirmed at the time of immersion in water.

Example 2

The conductive polymer composition film was formed in a similar way as example 1 except that phenyl glycidyl ether was used as the compound with one epoxy group. Then the conductivity and the water resistance were evaluated in a similar way as example 1.

Example 3

A solid electrolytic capacitor of example 3 of the present invention is explained with reference to FIG. 1. The sintered body of tantalum powder was selected as the valve metal 1. As shown in FIG. 1, the solid electrolytic capacitor according to example 3 of the present invention includes the valve metal 1 as an anode side electrode, and the dielectric oxide film layer 2 obtained by anodizing the surface of the valve metal 1. Further, the solid electrolytic capacitor includes the conductive polymer layer 3 as a solid electrolyte, the graphite layer 4 and the silver layer 5 as a cathode layer, the exterior electrodes 7, and the exterior resin 9.

A method of producing a solid electrolytic capacitor is explained hereinafter. The sintered body of tantalum powder was anodized in a phosphoric acid aqueous solution to obtain a pellet in which the entire surface of the tantalum powder was coated with the dielectric oxide film layer 2. Next, the pellet was immersed in the conductive polymer suspension solution produced in example 1, and then taken out. After that, the operation of reacting and drying at 125.degree. C. was repeated to form the conductive polymer layer 3. The cathode layer built up of the graphite layer 4 and the silver layer 5, the exterior electrode 7, and the exterior resin 9 were formed sequentially over the conductive polymer layer 3 to produce the solid electrolytic capacitor.

Immediately after the production and after a moisture resistance evaluation (1000 hours) in the atmosphere at 65.degree. C. and 95% RH, ESR of the produced solid electrolytic capacitor was measured using an LCR (Inductance Capacitance Resistance) meter at a frequency of 100 kHz. In the measurement result, the entire area of the cathode part was standardized to a unit area (1 cm$^2$). These results are shown in Table 2.

Example 4

A solid electrolytic capacitor of example 4 of the present invention is explained with reference to FIG. 1. The sintered body of tantalum powder was selected as the valve metal 1. The sintered body of tantalum powder was anodized in a phosphoric acid aqueous solution to obtain a pellet in which the entire surface of the tantalum powder was coated with the dielectric oxide film layer 2. Next, the pellet coated with this dielectric oxide film layer 2 was immersed for 10 minutes in 20% by weight of p-toluenesulfonic acid ferric ethanol solution, which is an oxidant. After drying the pellet at 60.degree. C. for 30 minutes, the pellet was immersed in a 3,4-ethylenedioxythiophene solution for 10 minutes, held at room temperature for 30 minutes, and 3,4-ethylenedioxythiophene was polymerized. The series of polymerization operation that the oxidant is filled and dried, and 3,4-ethylenedioxythiophene is filled was repeated 5 times to form a first conductive polymer layer built up of a conductive polyethylenedioxythiophene layer.

After immersing the pellet in the conductive polymer suspension solution produced in example 1 and taking the pellet out, a reaction and a drying processes at 125.degree. C. were performed to form a second conductive polymer layer over the first conductive polymer layer formed by a chemical polymerization. The cathode layer built up of the graphite layer 4 and the silver layer 5, the exterior electrode 7, and the exterior resin 9 were formed sequentially over the conductive polymer layer 3, which is built up of the first and the second conductive polymer layer to produce the solid electrolytic capacitor.

In a similar way as example 3, immediately after the production and after a moisture resistance evaluation (1000 hours), ESR of the produced solid electrolytic capacitor was measured at a frequency of 100 kHz. The result is shown in Table 2.

Example 5

A solid electrolytic capacitor was produced in a similar way as example 3 except that porous aluminum was selected for the valve metal. Then immediately after the production and after a moisture resistance evaluation (1000 hours), ESR of the produced solid electrolytic capacitor was measured at a frequency of 100 kHz. The result is shown in Table 2.

Comparative Example 1

A conductive polymer composition was produced in a similar way as example 1 except that the compound with one epoxy group was not added. Then, the state of the sulfone group, the conductivity and the water resistance were evaluated in a similar way as example 1. The analysis result by FTIR is shown in FIG. 2. The measurement result of the conductivity and the water resistance evaluation are shown in Table 1.

Comparative Example 2

A conductive polymer composition film was formed in a similar way as example 1 except that sorbitol polyglycidyl ether having 4 epoxy groups was used instead of the compound with one epoxy group. Then, the conductivity and the water resistance were evaluated in a similar way as example 1. The results are shown in Table 1.

Comparative Example 3

A solid electrolytic capacitor was produced in a similar way as example 3, except that the conductive polymer suspension solution described in comparative example 2 was used. Then, immediately after the production and after moisture resistance evaluation (1000 hours), ESR is measured at a frequency of 100 kHz and the result is shown in Table 2.

TABLE 1

|  | Conductivity (S/cm) | Water resistance |
|---|---|---|
| Example 1 | 215 | Good |
| Example 2 | 225 | Good |
| Comparative example 1 | 230 | Bad |
| Comparative example 2 | 210 | Film swollen |

Water resistance at immersion in water:
Good - No dissolution and swelling
Film swollen - No dissolution but film swollen
Bad - Dissolution confirmed

TABLE 2

|  | ESR(mΩ · cm$^2$) | | |
|---|---|---|---|
|  | Immediately after production [0 hr] | After moisture resistance test [1000 hrs] | ESR[1000 hrs]/ ESR[0 hr] |
| Example 3 | 2.3 | 3.5 | 1.5 |
| Example 4 | 2.1 | 2.9 | 1.4 |
| Example 5 | 2.0 | 2.9 | 1.5 |
| Comparative example 3 | 2.2 | 4.6 | 2.1 |

As shown in Table 1, the conductive polymer composition according to the present invention did not lose the conductivity and improves the water resistance compared to the comparative examples 1 and 2. The water resistance effect by the present invention is obvious. This is because that as the compound with one epoxy group is contained in the conductive polymer suspension solution, the compound with one epoxy group having few steric hindrances is sufficiently spread into the undoped hydrophilic functional groups of polyanion origin, thereby weakening the hydrophile property of the hydrophilic functional group.

As can be seen from the measurement result of FTIR in FIG. 2, the peak of the sulfone group origin decreased near 1190 cm$^{-1}$. Further, the peak of the sulfonic acid ester origin increased near 1348 cm$^{-1}$ from the measurement result of FTIR shown in FIG. 2. Further, it was confirmed that the compound with one epoxy group reacted with the sulfone group, which is hydrophilic functional groups, and changed to the sulfonic acid ester with weaker hydrophile property. Therefore, the conductive polymer composition according the present invention has excellent water resistance.

As can be seen from Table 2, the solid electrolytic capacitor having the conductive composition of the present invention as the conductive polymer layer is excellent in humidity-tolerant reliability, as the conductive polymer composition has the high water resistance property.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A conductive polymer composition comprising:
    a conductive polymer; and
    a polyanion that includes a hydrophilic group, the polyanion functioning as a dopant of the conductive polymer, wherein
    the conductive polymer composition does not comprise a silane coupling agent, and
    at least a part of the hydrophilic group of the polyanion is condensed with an epoxy group in a compound with one epoxy group.

2. The conductive polymer composition according to claim 1, wherein at least a part of the hydrophilic group of the polyanion is converted to a group with a weaker hydrophile property than the hydrophilic group by condensing with the epoxy group.

3. The conductive polymer composition according to claim 1, wherein
    the epoxy group and the hydrophilic group of the polyanion are condensed in a conductive polymer suspension solution that includes the conductive polymer with the polyanion as a dopant and the compound with one epoxy group, and
    after the condensation or in a same process as the condensation, a solvent in the conductive polymer suspension solution is evaporated.

4. The conductive polymer composition according to claim 3, wherein the conductive polymer is thiophene or a thiophene derivative.

5. The conductive polymer composition according to claim 3, wherein the polyanion is polystyrene sulfonic acid origin.

6. The conductive polymer composition according to claim 3, wherein the polyanion and the compound with one epoxy group are reacted by heat from 100.degree. C. to 250.degree. C.

7. The conductive polymer composition according to claim 1, wherein the conductive polymer is thiophene or a thiophene derivative.

8. The conductive polymer composition according to claim 1, wherein the polyanion is polystyrene sulfonic acid origin.

9. The conductive polymer composition according to claim 1, wherein the compound with one epoxy group is selected from the group consisting of allyl glycidyl ether, 2-ethylhexyl glycidyl ether, phenyl glycidyl ether, p-tert-buthylphenyl glycidyl ether, N-glycidyl phthalimide, dibromophenyl glycidyl ether, poly(1-5)oxyalkylene(C2-4)phenyl glycidyl ether, poly(1-5)oxyalkylene(C2-4)methylphenyl glycidyl ether, and alkyl(C8-18)polyoxyalkylene glycidyl ether.

10. A method of producing a conductive polymer composition comprising:
    preparing a suspension solution, the suspension solution being made by dispersing a conductive polymer with a polyanion as a dopant in water, a polar organic solvent, or a mixture of water and the polar organic solvent;
    adding a compound with one epoxy to the suspension solution;
    reacting the polyanion with the epoxy group; and
    evaporating the solvent in the suspension solution.

11. The method according to claim 10, wherein the polyanion and the compound with one epoxy are reacted by heat from 100.degree.C to 250.degree. C.

12. A solid electrolytic capacitor that uses a conductive polymer composition to a solid electrolyte layer, the conductive polymer composition comprising:
    a conductive polymer; and
    a polyanion that includes a hydrophilic group, the polyanion functioning as a dopant of the conductive polymer, wherein
    the conductive polymer composition does not comprise a silane coupling agent, and
    at least a part of the hydrophilic group of the polyanion is condensed with a epoxy group in a compound with one epoxy group.

13. The solid electrolytic capacitor according to claim 12, wherein at least a part of the hydrophilic group of the polyanion is converted to a group with a weaker hydrophile property than the hydrophilic group by condensing with the epoxy group.

14. The solid electrolytic capacitor according to claim 12, wherein
    the epoxy group and the hydrophilic group of the polyanion are condensed in a conductive polymer suspension solution that includes the conductive polymer with the polyanion as a dopant and the compound with one epoxy group, and
    after the condensation or in a same process as the condensation, a solvent in the conductive polymer suspension solution is evaporated.

15. The solid electrolytic capacitor according to claim 14, wherein the conductive polymer is thiophene or a thiophene derivative.

16. The solid electrolytic capacitor according to claim 14, wherein the polyanion is polystyrene sulfonic acid origin.

17. The solid electrolytic capacitor according to claim 12, wherein the conductive polymer is thiophene or a thiophene derivative.

18. The solid electrolytic capacitor according to claim 12, wherein the polyanion is polystyrene sulfonic acid origin.

* * * * *